United States Patent [19]

Luz

[11] Patent Number: 5,764,104
[45] Date of Patent: Jun. 9, 1998

[54] METHOD AND SYSTEM FOR REDUCING NOISE IN A HYBRID MATRIX AMPLIFIER

[75] Inventor: Yuda Yehuda Luz, Euless, Tex.

[73] Assignee: Motorola, Inc., Schaumburg, Ill.

[21] Appl. No.: 656,027

[22] Filed: May 31, 1996

[51] Int. Cl.$^6$ .................................. H03F 3/68; H03F 1/26
[52] U.S. Cl. ...................... 330/124 R; 330/149; 330/295
[58] Field of Search ........................... 330/124 R, 149, 330/295; 375/296, 297; 455/63

[56] References Cited

U.S. PATENT DOCUMENTS

| | | | |
|---|---|---|---|
| 3,732,217 | 5/1973 | Gerset et al. | 330/56 |
| 3,917,998 | 11/1975 | Welti. | |
| 5,287,069 | 2/1994 | Okubo et al. | 330/149 |

OTHER PUBLICATIONS

Sandrin, W.A., "The Butler Matrix Transponder", Comstat Technical Review, vol. 4, No. 2, Fall 1974, pp. 319–344.

Meredith, Sheldon, presentation on Cellwave Smart System at "Second Annual Workshop on Smart Antennas in Wireless Mobile Communications", Jul. 20–21, 1995, Stanford University.

Gerst, Carl. W. "Hybrid Matrix Amplifiers", An Anaren White Paper, Nov. 1995.

Primary Examiner—James B. Mullins
Attorney, Agent, or Firm—Bruce Terry

[57] ABSTRACT

An input signal (102) and a dithering signal (106) are coupled to an input of a n by m transform matrix (98). The input signal (102) and the dithering signal (106) are transformed to produce m transformed signals, which are then amplified using a plurality of amplifiers (64). The amplified signals are then input into an m by n inverse transform matrix (100) that performs an inverse transform to produce a low noise output signal. The low noise output signal may be passed through a band pass filter (74) to remove out-of-band noise derived from the dithering signal and provide a filtered output signal (110). The transform matrix (98) and inverse transform matrix (100) may be implemented with Fourier transform matrices or a Butler transform matrices.

21 Claims, 6 Drawing Sheets

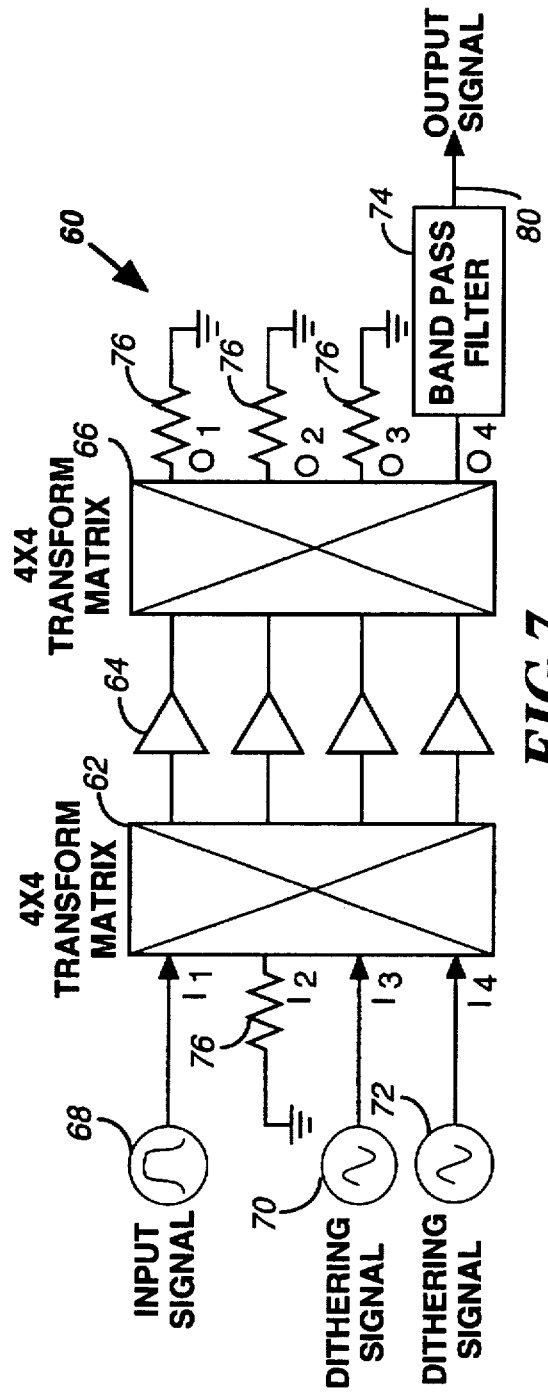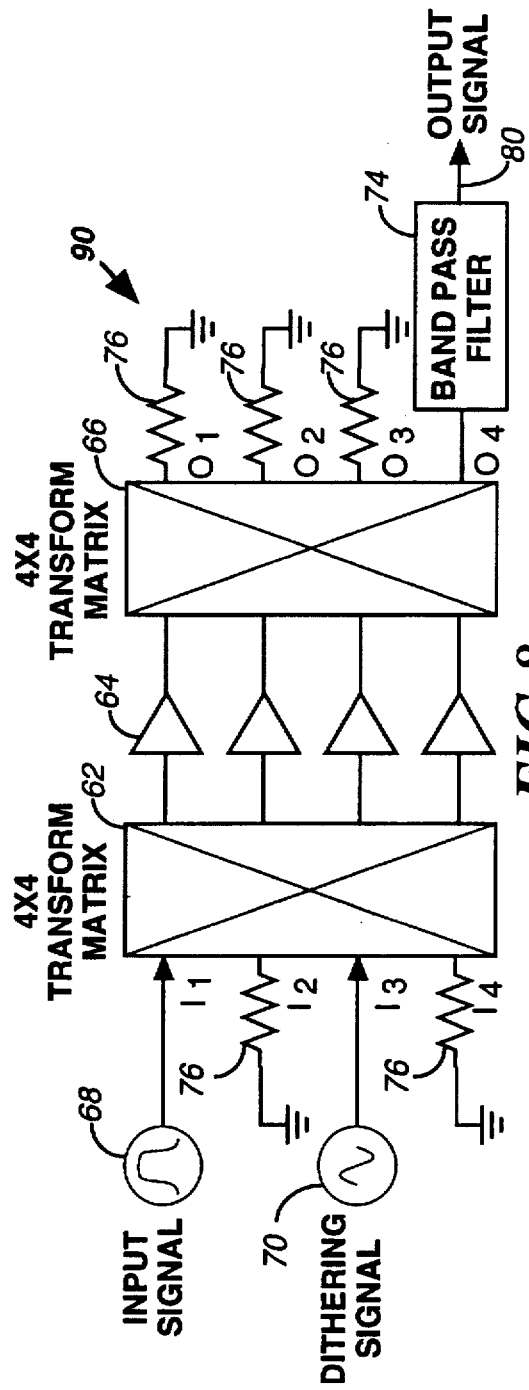

1

METHOD AND SYSTEM FOR REDUCING NOISE IN A HYBRID MATRIX AMPLIFIER

FIELD OF THE INVENTION

The present invention is related in general to signal amplification, and more particularly to an improved method and system for reducing noise in a hybrid matrix amplifier.

BACKGROUND OF THE INVENTION

A hybrid matrix amplifier is a parallel set of amplifiers, each having inputs fed, and outputs combined, with multi-port matrices made up of hybrid couplers. The general configuration of a hybrid matrix amplifier is shown in FIG. 1. Hybrid matrices 22 and 26 connected in the manner shown create information paths—extending from $I_n$ to $O_n$—which are separate at the input ports $I_n$ and output ports $O_n$. Between the matrices, however, where amplifiers 24 are located, the signals are distributed evenly in amplitude, and have a specific phase relationship according to which input port $I_n$ the signal entered. When amplifiers 24 are placed between two matrices 22 and 26, all amplifiers share the amplification of the signal on the path $I_1$ to $O_1$, as well as signals on all other n-1 paths.

A basic building block of many transform matrices is a 90° hybrid- or 3 dB coupler, which is shown schematically in FIG. 2 as coupler 30. Coupler 30 has four ports: two input ports, A and B, and two output ports, $Y_1$ and $Y_2$. Coupler 30 is typically linear and reciprocal. Because of the reciprocal nature of coupler 30, input ports A and B can be interchanged with output ports $Y_1$ and $Y_2$. The coupler also has a given bandpass and characteristic impedances at the ports.

In operation, if signal A is received at input port A of coupler 30, the power or energy of the signal is split into two equal quantities, with one quantity fed to output port $Y_1$ and the other fed to output port $Y_2$. The signal phase of the power transmitted from output port $Y_2$ is delayed by 90 electrical degrees, or one-quarter of an operating wavelength, from the signal phase of the power transmitted from output port $Y_1$. Similarly, if the power of signal B is received at input port B, the power of the signal is split into two equal quantities, with half of the power fed to output port $Y_1$ and the other half fed to output port $Y_2$. And the signal phase of the power from signal B transmitted from output port $Y_1$ is delayed by 90 electrical degrees, or one-quarter of an operating wavelength, from the signal phase of the power transmitted from output port $Y_2$.

Thus, if signal A is applied to input port A, and signal B applied to input port B, signals appearing at output ports $y_1$ and $y_2$ are represented by the equations below.

$$Y_1 = \frac{A}{\sqrt{2}} \angle -90° + \frac{B}{\sqrt{2}} \angle -180°$$

$$Y_2 = \frac{A}{\sqrt{2}} \angle -180° + \frac{B}{\sqrt{2}} \angle -90°$$

$$\frac{1}{\sqrt{2}} \begin{bmatrix} -j & -1 \\ -1 & -j \end{bmatrix} \begin{bmatrix} A \\ B \end{bmatrix} = \begin{bmatrix} Y_1 \\ Y_2 \end{bmatrix} \quad j \text{ is } 1 \angle 90°$$

As shown by the above equations, if signal power is simultaneously applied to input ports A and B, signal superposition occurs because the coupler is linear.

In summary, any power received at an input port is divided equally between the output ports of the coupler, and signals transmitted by the output ports have a phase difference.

There are several ways to construct coupler 30. One way is to use shielded (double ground plane) striplines or microstriplines. This stripline coupling technique is schematically represented in FIG. 3 and described in U.S. Pat. No. 3,731, 217 to Gerst et al. (1973), which is incorporated herein by reference.

With reference now to FIG. 4, a 4×4 Fourier Transform Matrix is illustrated. As illustrated, Fourier Transform Matrix 40 includes four couplers 30 connected as shown. Such a 4×4 transform matrix has four inputs and four outputs.

FIG. 5 shows a 4×4 transform matrix known as a Butler type. Butler matrix 50 is essentially the Fourier Transform Matrix 40 with the addition of phase shifters 52 and 54. If phase shifters 52 and 54 are 45° phase shifters, Butler matrix 50 is referred to as a 45° Butler matrix.

Referring again to FIG. 1, an ideal amplifier such as amplifier 24, would pass all frequency components of an input signal with both amplitude and phase relationships unchanged; the amplified signal would be a perfect scaled replica of the input signal. As a practical matter, however, amplifiers 24 often have a non-linear response, which may produce intermodulation distortion (IMD).

Intermodulation distortion may be defined as distortion characterized by the appearance of frequencies in the output, equal to the sum and difference frequencies of the fundamentals and integral multiples (harmonics) of the component frequencies present in the input. Intermodulation distortion is a problem because it appears as noise in the band of frequencies being amplified, and it also appears as out-of-band noise that may interfere with communication channels having other frequencies.

Additionally, when intermodulation distortion can be reduced, the power transmitted in-band may be increased without violating specifications that may define the bandwidth of the communication channel. Reducing IMD also reduces relative third and fifth order noise, thereby lowering interference with other communication channels.

In a cellular communications system, such as a code division multiple access (CDMA) cellular communications system based upon the Telecommunications Industries Association/Electronic Industries Association/Interim Standard-95 (TIA/EIA/IS-95) specification entitled Mobile Station-Base Station Compatibility Standard for Dual Mode Wide Band Spread Spectrum Cellular System, July 1993, it is desirable to limit the frequency spectrum of a transmitted signal to a frequency band defined in the specification. Because the frequency spectrum of energy radiated from a base station antenna includes skirts or sidebands which must be considered in compliance with the TIA/EIA/IS-95 frequency band specification, it is desirable to reduce signal energy in the skirts so that signal energy in the desired band may be increased without violating the frequency band specification.

A CDMA signal frequency spectrum 54 is shown in FIG. 6. Skirts 56, otherwise known as shoulders, are shown on either side of in-band frequencies 58. As may be seen, if the noise in skirts 56 is reduced, power in in-band frequencies 58 may be increased without violating the frequency band specification. This noise reduction and corresponding transmit power increase permits more efficient transmitter operation and increased transmitter range.

Therefore, a need exists for a method and apparatus to reduce intermodulation distortion in an amplifier, and more specifically, for an improved method and apparatus for reducing intermodulation distortion in a hybrid matrix amplifier.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein:

FIG. 7 is a high-level block diagram of the hybrid matrix amplifier according to an embodiment of the method and system of the present invention;

FIG. 8 is a high-level block diagram of an alternative embodiment of the hybrid matrix amplifier in accordance with the method and system of the present invention;

DETAILED DESCRIPTION OF THE INVENTION

Figure 1:
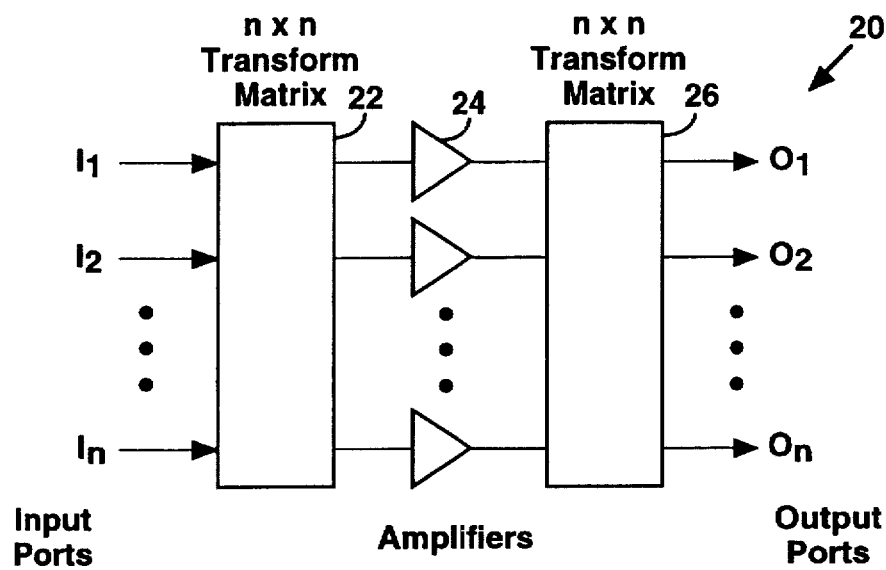
FIG. 1 is a high-level depiction of a prior art hybrid matrix amplifier.
Figure 2:
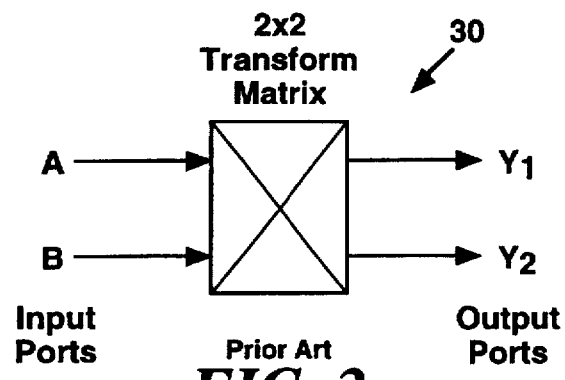
FIG. 2 is a schematic representation of a prior art coupler used to construct a transform matrix.
Figure 3:
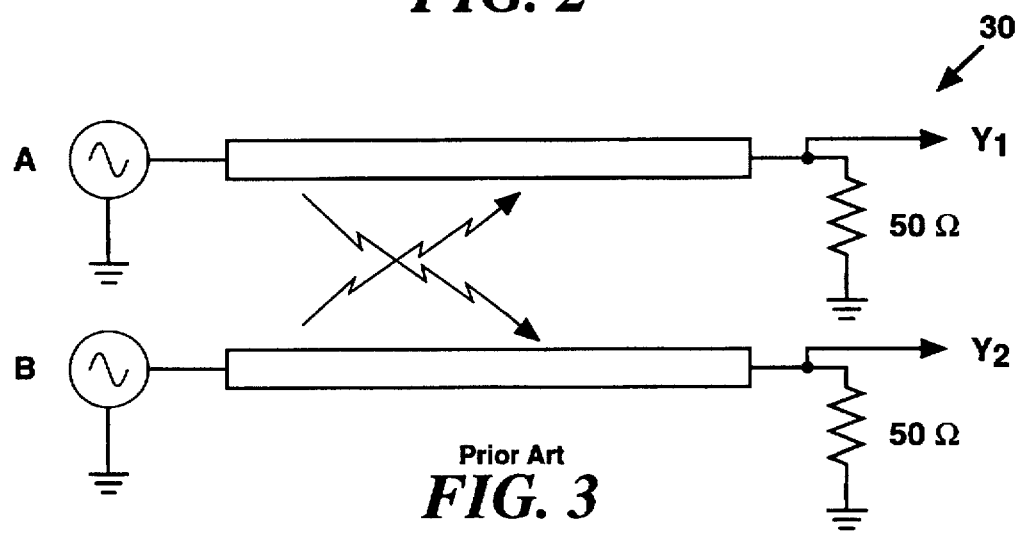
FIG. 3 is a high-level pictorial representation of the prior art coupler in FIG. 2.
Figure 4:
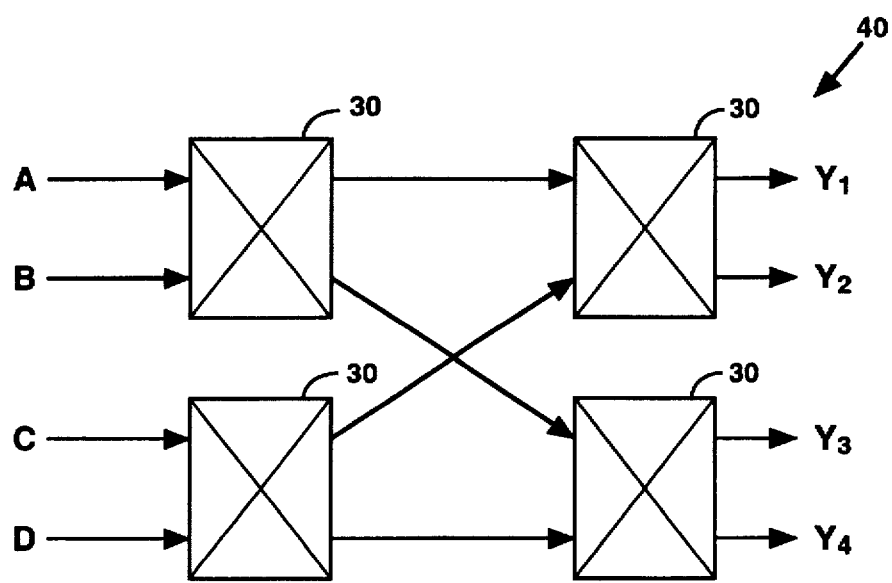
FIG. 4 is a high-level schematic representation of a prior art Fourier Transform Matrix.
Figure 5:
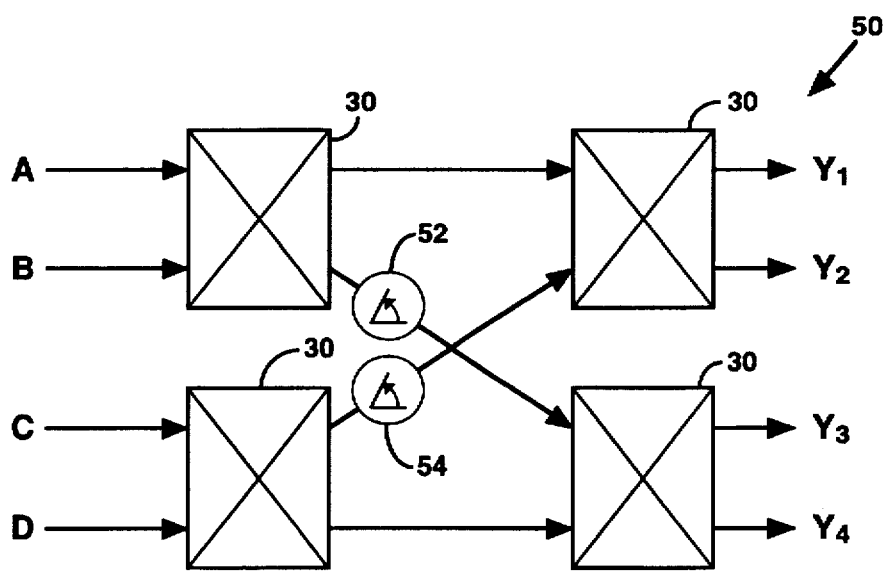
FIG. 5 is a high-level block diagram of a prior art Butler Transform Matrix.

With reference now to the figures, in particular with reference to FIG. 7, there is depicted a high-level block diagram of a hybrid matrix amplifier in accordance with an embodiment of the method and apparatus of the present invention. As illustrated, hybrid matrix amplifier 60 includes transform matrix 62 having with output ports coupled to amplifiers 64, and amplifier outputs connected to input ports of inverse transformed matrix 66. Transform matrix 62 is shown in the example of FIG. 7 as a 4×4 transform matrix having four inputs and four outputs. It should be noted that transform matrix 62 need not be a square matrix, and any size matrix larger than a 2×2 matrix may be selected. Thus, transform matrix 62 may be an n×m transform matrix.

Transform matrix 62 may be implemented with different types of matrix. For example, transform matrix 62 may be a Fourier transform matrix, a Butler transform matrix, or any other transform matrix that distributes signal power from one input to multiple outputs in varying phase relationships.

Amplifiers 64 receive a low level input signal and output a high level signal that substantially matches the input signal. Because amplifiers are typically not perfectly linear, the output of amplifier 64 will include some distortion. Such distortion may include intermodulation distortion (IMD) which is non-linear distortion characterized by the appearance of frequencies in the output, equal to the sum and difference frequencies of integral multiples of the component frequencies present in the input. Amplifiers 64 may be implemented with amplifiers sold under the part number "MHW927B" by Motorola Inc., of Schaumberg, Ill., 60196.

The outputs of amplifiers 64 are coupled to input ports of inverse transform matrix 66. Inverse transform matrix 66 is implemented with the same type of transform matrix as transform matrix 62. Additionally, inverse transform matrix 66 is typically the same size or dimension as transform matrix 62. Thus, if transform matrix 62 is a 4×4 Fourier transform matrix, inverse transform matrix 66 is preferably a 4×4 Fourier transform matrix.

At this point, note that a Fourier or Butler transform matrix can be used as its own inverse matrix. One purpose of inverse transform matrix 66 is to separate input signals into discrete output signals. Thus, a signal input at $I_1$, which is spread evenly over signals sent to amplifiers 64, is once again focused to a particular output, such as $O_4$. Transform matrix 62 and inverse transform matrix 66 may be implemented by the transform matrices sold under the part number "580014" by Anaren Microwave, Inc., in East Syracuse, N.Y., 13057.

Input signal generator 68 is used to provide a signal for amplification by hybrid matrix amplifier 60. In a preferred embodiment, input signal generator 68 is implemented with a CDMA carrier modulator, which produces a multi-channel digital signal in accordance with the Wideband Spread Spectrum Cellular System standard EIA/TIA/IS-95. Although the CDMA carrier generator is the preferred input signal generator, other input signals may be used in accordance with the method and system of the present invention.

Using a CDMA carrier generator for the input signal is beneficial because the dithering signal used to spread the noise out of the band of the random-natured CDMA signal is a continuous wave signal, which is easily generated. Other less random types of input signals, such as the signal used in an analog cellular phone system, require a random-natured dithering signal, which is somewhat more complicated and expensive to generate.

As shown in FIG. 7, input signal generator 68 is applied to input port $I_1$. Input signal generator 68 may be applied to any input port $I_n$, and more than one input signal generator 68 may be used to feed input ports of the same hybrid matrix amplifier 60.

Dithering signal generators 70 and 72 are coupled to inputs $I_3$ and $I_4$, respectively. Each of these dithering signal generators produces a dithering signal, which in a preferred embodiment includes a sine wave having a frequency outside the frequency band used by input signal generator 68. Dithering signal generators 70 and 72 may be implemented with a simple oscillator circuit. For a more detailed discussion of selecting a dithering signal, see the description of FIG. 11 below.

Bandpass filter 74 is coupled to the output, such as $O_4$, on which the amplified input signal appears. A bandpass filter is a device which transmits a band of frequencies and substantially blocks or absorbs all other frequencies not in the specified band. Bandpass filter 74 is used to attenuate any frequencies derived from dithering signals 70 and 72. Therefore, bandpass filter 74 is selected to pass signals generated by input signal generator 68 and substantially block frequencies generated by dithering signal generators 70 and 72.

Unused input and output ports of both transform matrix 62 and inverse transform matrix 66 may be terminated by terminators 76. Terminators 76 are selected to match, for example, the characteristic impedance of output ports $O_1$, through $O_3$ and $I_2$ shown in FIG. 7.

Therefore, input signal, which is generated by input signal generator 68, is amplified by hybrid matrix amplifier 60 to produce an amplified, low-noise output signal at amplifier output 80.

With reference now to FIG. 8, there is depicted an alternative embodiment of a hybrid matrix amplifier in accordance with the method and system of the present invention. In this example, hybrid matrix amplifier 90 includes only dithering signal generator 78 applied to input $I_3$. Input $I_4$ is terminated by terminator 76.

Using more than one dithering signal at the inputs to transform matrix 62 allows a system designer to choose one dithering signal to reduce third order $IMD_3$ noise and another to reduce fifth order $IMD_5$ noise. When one dithering signal is used, the designer may select the dithering signal frequency to provied the greatest noise reduction in either $IMD_3$ noise or $IMD_5$ noise, depending upon which is more important to meeting a system specification.

When the input signal is a spread spectrum CDMA source, and the dithering signals are unmodulated sine waves at out-of-band frequencies, the input signals are focused at selected output ports, such as $O_{n-1}$ and $O_n$, and the intermodulation distortion noise of amplifiers 64 is rendered non-coherent, where only a fraction of the IMD noise reaches the signal output ports. In a 4×4 hybrid matrix amplifier, only one-fourth of the IMD noise power reaches the selected output port. This 6 dB improvement may be increased by an additional 3 dB if the matrix size is doubled to 8×8.

Figure 9:
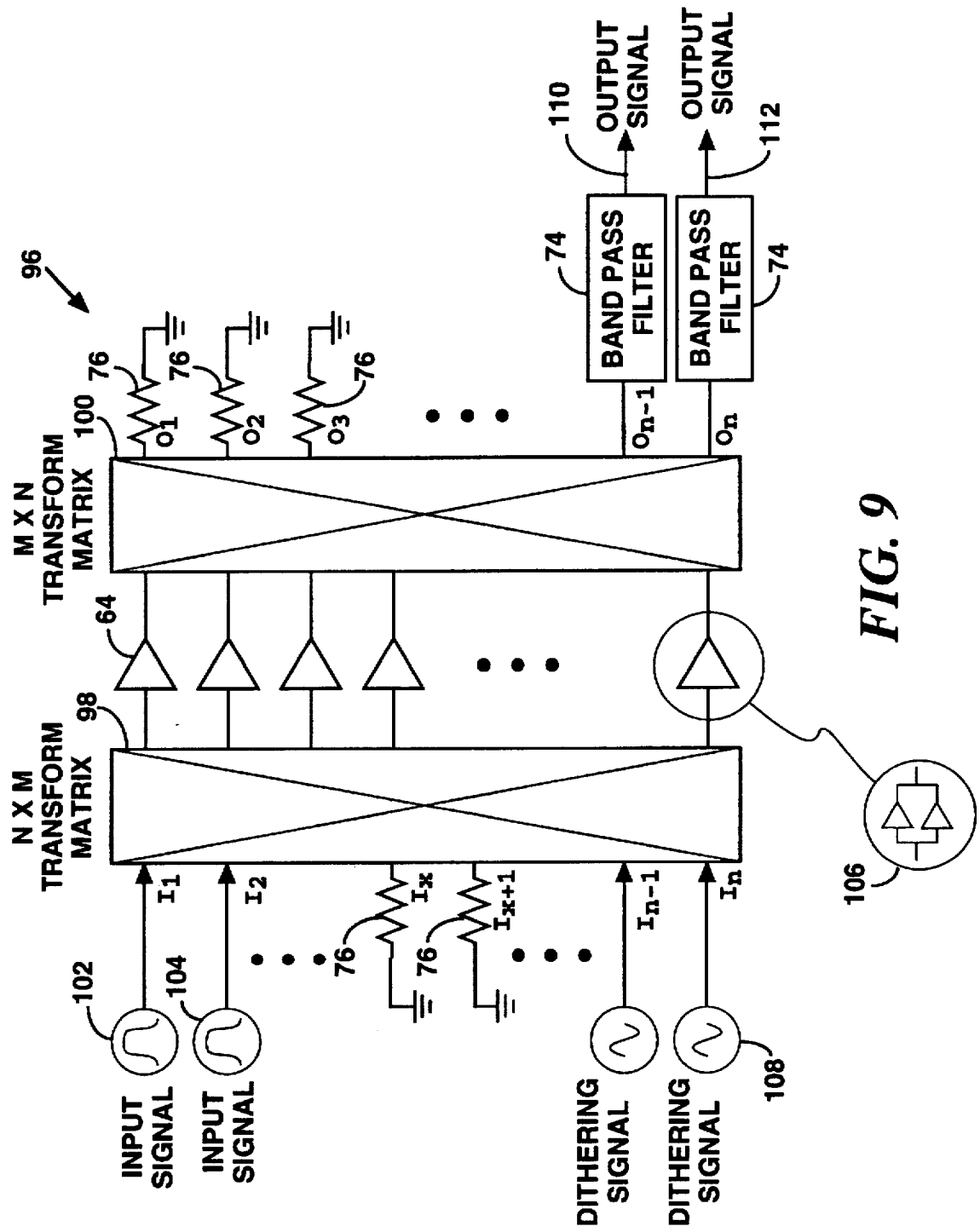
FIG. 9 is yet another high-level block diagram of an alternate embodiment of the hybrid matrix amplifier of the method and system of the present invention.

Referring now to FIG. 9, there is depicted a generic schematic representation of a hybrid matrix amplifier in accordance with an embodiment of the method and system of the present invention. As depicted, m number of amplifiers 64 are connected between n×m transform matrix 98 and m×n inverse transform matrix 100. Transform matrices 98 and 100 may be implemented with Fourier transform matrices or Butler matrices. Matrices 98 and 100 may not be square, as indicated by the n×m and m×n references.

Unused inputs and outputs may be terminated by terminators 76 shown at inputs $I_x$ and $I_{x+1}$ and outputs $O_1$ through $O_3$. Terminators 76 are typically implemented with resistors that match the input or output impedance of the unused ports.

In FIG. 9, more than one input signal-generated by input signal generators 102 and 104—is coupled to trasform matrix 98. When such signal generators generate CDMA modulated signals, these signals may be on two different carriers, or, if they are on the same carrier, they may be coupled to antennas serving different cell sectors at the same base station.

In addition to more than one input signal, more than one dithering signal may be input into hybrid matrix amplifier 96. This is shown at dithering signal generator 106 and 108, which are input into ports $I_{n-1}$ and $I_n$. If one or more dithering signals are used, the frequencies of the dithering signals are selected to spread IMD noise outside a receive CDMA band, which is typically adjacent to the transmit CDMA band. See FIG. 11 for a graphic representation of the relative locations of these frequency bands.

Bandpass filters 74 may be coupled to selected output ports, such as output ports $O_{n-1}$ and $O_n$, to produce amplifier outputs 110 and 112. Bandpass filters 74 remove or attenuate frequencies resulting from dithering signals 106 and 108.

In yet another embodiment of the present invention, each amplifier 64 may be implemented by two or more amplifiers connected in parallel, as shown at reference numeral 114.

Thus, in FIG. 9, instead of using m number of amplifiers 64, 2m number of amplifiers may be used where two amplifiers are connected in parallel to amplify the signal along each path from, for example, $I_1$ to $O_1$.

An advantage of using a hybrid matrix amplifier in a cellular communications system is the ability of the amplifier to operate in a degraded mode wherein one or more of amplifiers 64 has failed. In such a degraded mode, the amplifier continues to amplify, but with less isolation between signals along signal paths from the input ports to the output ports. Therefore, rather than having a total amplifier failure when one amplifier 64 fails, the hybrid matrix amplifier operates in a mode where the signals on the inputs appear mainly at the corresponding output, but with some of the signal power spread over various other outputs.

Figure 10:
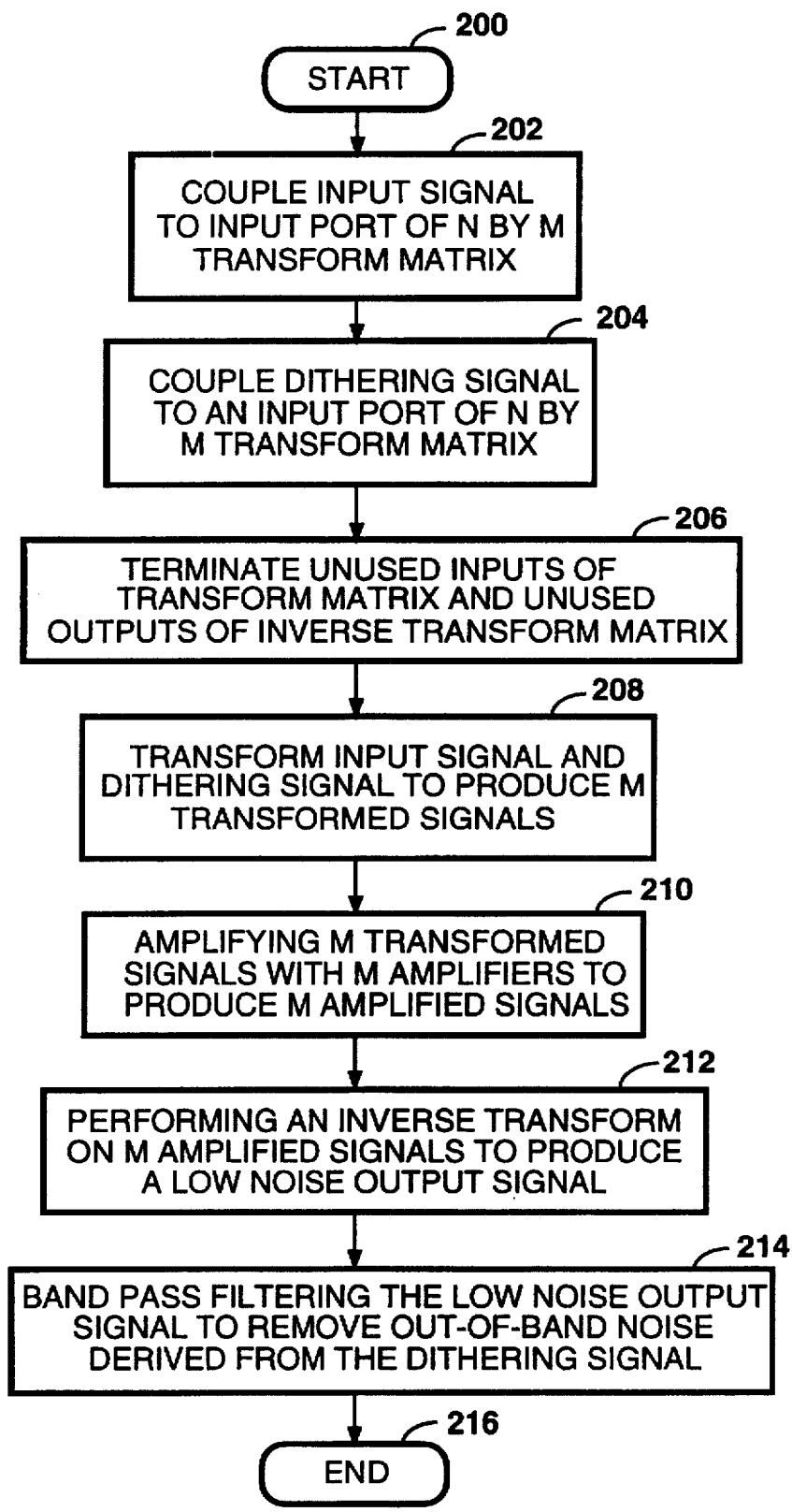
FIG. 10 is a high-level logic flowchart which illustrates the method and operation of an embodiment of the present invention.

With reference now to FIG. 10, there is depicted a high-level flowchart illustrating the process of reducing noise in a hybrid matrix amplifier in accordance with an embodiment of the method and apparatus of the present invention. As illustrated, the process begins at block 200, and thereafter passes to block 202 where an input signal is coupled to an input port of an n×m transform matrix. Such an n×m transform matrix may be implemented with either a Fourier transform matrix or a Butler transform matrix, which may or may not be square. The input signal is preferably a spread spectrum CDMA carrier, such as the signals modulated in accordance with the TIA/EIA/IS-95 standard.

Next, dithering signals are coupled to at least one input port of the n×m transform matrix, as illustrated at block 204. Such a dithering signal is preferably an unmodulated sine wave at a frequency outside the band of frequencies occupied by the input signal.

As depicted at block 206, unused input ports of the transform matrix and unused output ports of an inverse transform matrix are terminated. Typically, such termination is accomplished by connecting a grounded resistor to the input or output port, where the resistor matches the characteristic impedance of the input or output port.

Next, the input signal and the dithering signal are transformed to produce m transformed signals, as illustrated at block 208. Such m transformed signals each include a fractional portion of the power applied at all the inputs, with each fractionally powered signal having a predetermined phase relationship to the remaining fractions in other transformed signals.

Next, the m transformed signals are amplified with m amplifiers to produce m amplified signals, as depicted at block 210. Each of the m amplifiers may be implemented with a single amplifier, or one or more amplifiers connected in parallel.

The m amplified signals are then coupled to input ports of an m×n inverse transform matrix, and an inverse transform is performed to produce a low noise output signal, as illustrated at block 212. The output signal has a low noise content because the intermodulation distortion of the amplifiers has been steered or directed away from the output port that outputs the output signal.

Finally, as depicted at block 214, the low noise output signal is bandpass filtered to remove out-of-band noise derived from amplifying the dithering signal, which is applied to at least one of the input ports of the hybrid matrix amplifier. Thereafter, the process ends, as illustrated at block 216.

In the process described above, more than one input signal may be coupled to separate ports of the n×m transform matrix. If more than one input signal is used, the same number of low noise output signals are produced at an output port of the inverse transform matrix. Similarly, more than one dithering signal may be coupled to separate input ports of the n×m transform matrix. The frequency of each of these dithering signals is selected to be out of the band of frequencies used for all input signals. If more than one low noise output signal is provided, each is bandpass filtered with an appropriate bandpass filter to remove out-of-band noise derived from any dithering signals applied at the inputs of the hybrid matrix amplifier.

Figure 11:
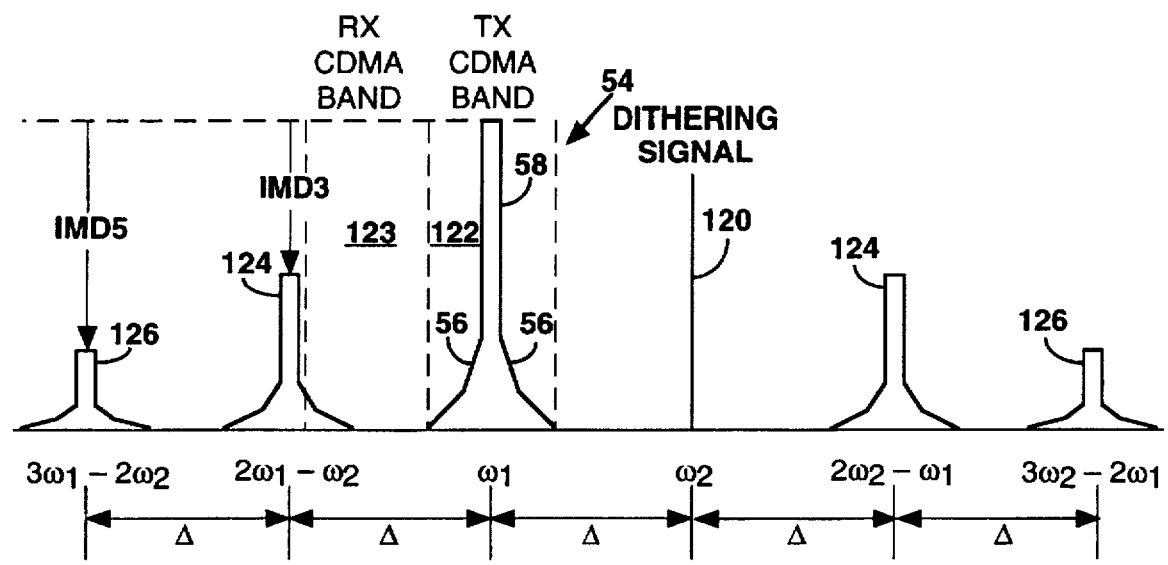
FIG. 11 is a frequency-domain representation of the output of the hybrid matrix amplifier in accordance with an embodiment of the method and apparatus of the present invention.
Figure 6:
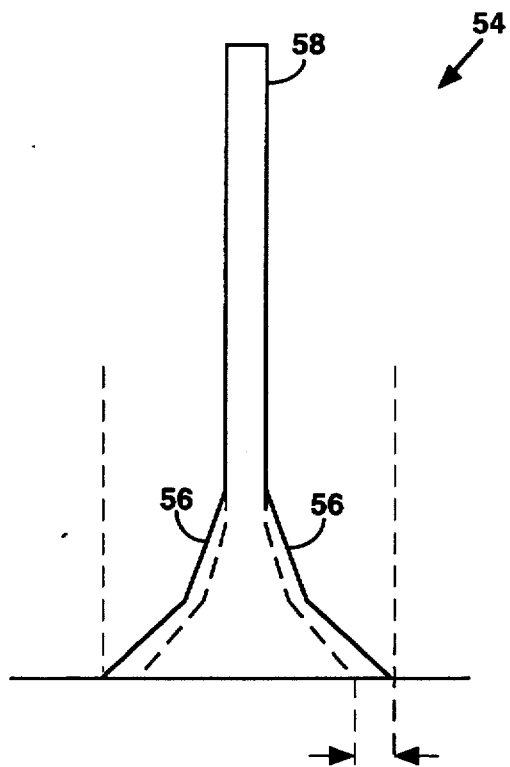
FIG. 6 is a frequency-domain representation of a CDMA signal frequency spectrum.

With reference now to FIG. 11, there is depicted a frequency-domain representation of the output of the hybrid matrix amplifier in accordance with an embodiment of the method and apparatus of the present invention. CDMA signal frequency spectrum 54 is shown at fundamental frequency $\omega_1$. Dithering signal 120 is selected so that it is not within input frequency band 122. The frequency, $\omega_2$, of Dithering signal 120 is selected to be a delta frequency away from the center frequency of CDMA signal frequency spectrum 54, as represented by the Δ symbol. The Δ frequency is selected to spread IMD noise outside of frequencies for receive band 123, which is typically adjacent to transmit band 122. Notice that the distance Δ between the input signals—the center frequency of transmit band 122 and dithering signal 120—is the same as the distance between the input signals and IMD noise components 124 and 126. Therefore moving dithering signal 120 away from the center frequency of transmit band 122 also moves IMD noise components 124 and 126 further out. However, dithering signal 120 should not be selected too far out of the preferred frequency range for amplifiers 64.

Also shown in FIG. 11 are representations of third order IMD noise 124 (IMD$_3$) and fifth order IMD noise 126 (IMD$_5$). Tests have indicated a reduction in IMD noise 124 and 126 according to the test results below in Tables 1 and 2.

TABLE 1

| Dithering | CDMA signal output | IMD$_3$ +900 hHz | IMD$_5$ + 2.25 Mhz |
| --- | --- | --- | --- |
| No | 3.5 Watts | 34.5 dBc | 52.5 dBc |
| Yes −7 dBc | 3.5 Watts | 36.5 dBc | 56.5 dBc |

TABLE 2

| Dithering | CDMA signal output | IMD$_3$ +900 hHz | IMD$_5$ + 2.25 Mhz |
| --- | --- | --- | --- |
| No | 2.2 Watts | 37.4 dBc | 54.9 dBc |
| Yes −5 dBc | 2.2 Watts | 43.4 dBc | 57.9 dBc |

In summary, the present invention uses a dithering signal coupled to at least one input of a hybrid matrix amplifier to lower the noise level in a desired output signal at one output port of the amplifier while redirecting such noise to unused amplifier output ports.

The foregoing description of a preferred embodiment of the invention has been presented for the purpose of illustration and description. It is not intended to be exhaustive or to limit the invention to the precise form disclosed. Modifications or variations are possible in light of the above teachings. The embodiment was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method for amplifying an input signal, said method comprising the steps of:
    coupling said input signal to an input of a n by m transform matrix, wherein n and m are integers greater than 2;
    coupling a dithering signal to another input of said n by m transform matrix, wherein said dithering signal is uncorrelated to said input signal;
    transforming said input signal and said dithering signal using said n by m transform matrix to produce m transformed signals;
    amplifying a plurality of said m transformed signals using more than one amplifier to produce amplified signals; and
    performing an inverse transform on said amplified signals using an m by n inverse transform matrix to produce a low noise output signal.

2. The method for amplifying an input signal according to claim 1 wherein said n by m transform matrix includes an n by m Fourier transform matrix.

3. The method for amplifying an input signal according to claim 1 wherein said n by m transform matrix includes an n by m Butler transform matrix.

4. The method for amplifying an input signal according to claim 1 further including the step of band pass filtering said low noise output signal.

5. The method for amplifying an input signal according to claim 1 further including the step of band pass filtering said low noise output signal to remove out-of-band noise derived from said dithering signal.

6. The method for amplifying an input signal according to claim 1 wherein said dithering signal includes a sinusoidal signal.

7. The method for amplifying an input signal according to claim 1 further including the step of amplifying said m transformed signals using m amplifiers to produce m of said amplified signals.

8. The method for amplifying an input signal according to claim 1 further including the step of amplifying said m transformed signals using 2m amplifiers to produce m amplified signals, each of said m transformed signals being amplified by 2 of said 2m amplifiers connected in parallel.

9. The method for amplifying an input signal according to claim 1 further including the step of terminating unused inputs on said n by m transform matrix.

10. The method for amplifying an input signal according to claim 1 further including the step of terminating unused outputs on said m by n inverse transform matrix.

11. The method for amplifying an input signal according to claim 1 wherein said input signal is a broad-band code division multiple access signal.

12. An apparatus for amplifying an input signal comprising:
    signal modulation means for providing an input signal;
    dithering signal generation means for providing a dithering signal that is uncorrelated to said input signal;
    transforming means for transforming said input signal and said dithering signal into two or more transformed signals;
    a plurality of amplifying means for amplifying said two or more transformed signals to produce amplified signals; and inverse transforming means for transforming said amplified signals to produce an output signal.

13. The apparatus for amplifying an input signal according to claim 12 wherein said transforming means comprises an n by m transform matrix, and wherein said inverse transforming means comprises an m by n inverse transform matrix, wherein n and m are integers greater than 2.

14. The apparatus for amplifying an input signal according to claim 13 wherein said n by m transform matrix is an n by m Fourier transform matrix, and wherein said m by n inverse transform matrix is an m by n inverse Fourier transform matrix.

15. The apparatus for amplifying an input signal according to claim 13 wherein said n by m transform matrix is an n by m Butler transform matrix, and wherein said m by n inverse transform matrix is an m by n inverse Butler transform matrix.

16. The apparatus for amplifying an input signal according to claim 12 further comprising a band pass filter coupled to said output signal for filtering out-of-band noise derived from said dithering signal and providing a filtered output signal.

17. The apparatus for amplifying an input signal according to claim 12 wherein said dithering signal generation means comprises means for generating a sinusoidal signal including at least one sine wave.

18. The apparatus for amplifying an input signal according to claim 12 wherein said plurality of amplifying means comprises m amplifiers to produce m of said amplified signals.

19. The apparatus for amplifying an input signal according to claim 12 further comprising terminators coupled to unused inputs of said transforming means.

20. The apparatus for amplifying an input signal according to claim 12 further comprising terminators coupled to unused outputs of said inverse transforming means.

21. The apparatus for amplifying an input signal according to claim 12 wherein said signal modulation means comprises means for providing a broad-band code division multiple access signal.

* * * * *